(12) United States Patent
Wong et al.

(10) Patent No.: US 11,721,571 B2
(45) Date of Patent: Aug. 8, 2023

(54) LOOP HEIGHT MEASUREMENT OF OVERLAPPING BOND WIRES

(71) Applicant: EMAGE EQUIPMENT PTE. LTD., Singapore (SG)

(72) Inventors: Soon Wei Wong, Singapore (SG); Victor Vertoprakhov, Novosibirsk (RU)

(73) Assignee: EMAGE VISION PTE. LTD., Singapore (SG)

( * ) Notice: Subject to any disclaimer, the term of this patent is extended or adjusted under 35 U.S.C. 154(b) by 0 days.

(21) Appl. No.: 17/501,382

(22) Filed: Oct. 14, 2021

(65) Prior Publication Data

US 2022/0115253 A1  Apr. 14, 2022

(30) Foreign Application Priority Data

Oct. 14, 2020  (SG) ............................ 10202010193R

(51) Int. Cl.
| | | |
|---|---|---|
| H01L 21/67 | (2006.01) | |
| G01N 21/95 | (2006.01) | |
| G06T 7/60 | (2017.01) | |
| G06T 11/20 | (2006.01) | |
| H04N 23/56 | (2023.01) | |
| H04N 23/695 | (2023.01) | |
| H01L 23/00 | (2006.01) | |

(52) U.S. Cl.
CPC ... *H01L 21/67288* (2013.01); *G01N 21/9501* (2013.01); *G06T 7/60* (2013.01); *G06T 11/206* (2013.01); *H04N 23/56* (2023.01); *H04N 23/695* (2023.01); *G06T 2207/20072* (2013.01); *G06T 2207/30148* (2013.01); *H01L 24/49* (2013.01); *H01L 2224/4917* (2013.01)

(58) Field of Classification Search
None
See application file for complete search history.

(56) References Cited

U.S. PATENT DOCUMENTS 5,243,406 A * 9/1993 Ando ................ H01L 24/48
356/613
5,293,217 A * 3/1994 Sugawara ............ H01L 24/78
250/559.08

(Continued)

FOREIGN PATENT DOCUMENTS

DE  4003983 C1 * 8/1991 ............ G01N 21/956
JP  S63243805 A * 10/1988
(Continued)

OTHER PUBLICATIONS

English Machine Translation of Sho (JP 2009071051 A).*

*Primary Examiner* — Mohammed Jebari
(74) *Attorney, Agent, or Firm* — Thomas Horstemeyer, LLP

(57) ABSTRACT

An apparatus and method for measuring loop height of overlapping bonded wires, interconnecting the pads of a single or stacked silicon chips to the pads of a substrate taking the steps of: focussing of an optical assembly at multiple points of the bond wire including overlapping bond wires, capturing an image of the bond wire at each of the predetermined focused points; calculating the height of each point of the wire with respect to a reference plane; and tabulating the height data using the X, Y and Z coordinates.

5 Claims, 2 Drawing Sheets

(56) References Cited

U.S. PATENT DOCUMENTS

| | | | | |
|---|---|---|---|---|
| 5,298,989 | A | * | 3/1994 | Tsukahara ............ G01R 31/308 |
| | | | | 348/126 |
| 5,576,828 | A | * | 11/1996 | Tomiyama .............. H01L 24/85 |
| | | | | 250/559.34 |
| 5,583,641 | A | * | 12/1996 | Tomiyama .............. H01L 24/48 |
| | | | | 250/559.34 |
| 6,590,670 | B1 | * | 7/2003 | Kato ................ G01B 11/0608 |
| | | | | 356/609 |
| 2005/0094865 | A1 | * | 5/2005 | Cheng ................ G01B 11/026 |
| | | | | 356/602 |
| 2016/0254199 | A1 | * | 9/2016 | Chin ................ G01N 21/9501 |
| | | | | 356/237.5 |
| 2020/0388046 | A1 | * | 12/2020 | Amemiya ............... G06T 7/586 |
| 2021/0097670 | A1 | * | 4/2021 | Iinuma ............... G01B 11/0608 |
| 2021/0202432 | A1 | * | 7/2021 | Yuzawa .................. H01L 24/78 |

FOREIGN PATENT DOCUMENTS

| | | | | | |
|---|---|---|---|---|---|
| JP | S63275129 | A | * | 11/1988 | |
| JP | H05175310 | A | * | 7/1993 | ............ H01L 24/78 |
| JP | H05175311 | A | * | 7/1993 | ............ H01L 24/78 |
| JP | H0883829 | A | * | 3/1996 | ............ G01N 21/88 |
| JP | 2004288708 | A | * | 10/2004 | ............ H01L 24/48 |
| JP | 2009071051 | A | * | 4/2009 | ............ H01L 24/78 |
| TW | 511208 | B | * | 11/2002 | ........ H05K 13/0812 |
| WO | WO-2010090605 | A1 | * | 8/2010 | ......... G01N 21/8806 |

\* cited by examiner

LOOP HEIGHT MEASUREMENT OF OVERLAPPING BOND WIRES

CROSS-REFERENCE TO RELATED APPLICATIONS

The present application claims priority to, and the benefit of, Singapore Patent Application SG10202010193R, filed on Oct. 14, 2020, and entitled "LOOP HEIGHT MEASUREMENT OF OVERLAPPING BOND WIRES," which is incorporated by reference as if set forth herein in its entirety.

FIELD OF THE INVENTION

The present invention relates to a loop height inspection apparatus for determining the height and subsequently the bonding profile of the bonded wires between the pads of semiconductor chips and the pads of a substrate which may be a plastic (Eg: BGA substrate) or metal substrate (Eg: Lead frame). The invention is especially useful for, but not limited to, determining the profile of the bonding wire loop comprising closely overlapping bonding wires.

BACKGROUND OF THE INVENTION

Wire bonding is used in the Semiconductor assembly process as a means of making electrical interconnections between Semiconductor chips and Substrates (such as lead-frames and printed circuit boards). Wires made from gold, aluminium and copper are commonly used. The interconnect process is automated and it is important to ensure that the bonded wires maintain a certain profile that includes a minimum height, length and distances between neighbouring electrical connecting pads. The wire bonding height is commonly referred to as loop height. The highest point of the bond wire loop plays a major role in determining the thickness of the plastic molding that seals and covers the area of the Silicon Chip and its peripheral connections. Therefore it is important not only to maintain the correct height across all the bonding wires around the Silicon chip, but also to minimise the height of the bonding wire loop to be as low as possible to aid in obtaining thin and low weight packages that in turn aids in designing of various types of slim gadgets. For example, slim mobiles phones, medical equipment, space exploration satellites . . . etc.

With improvements in back-end semiconductor technology and techniques, it is possible to bond wires at low loop height with thin wires. Due to the high density of the silicon chip interconnecting pads and various other factors, it is common for machines to produce occasional wire bond loops that are slighting lower or higher than the optimum programmed loop height. The interconnecting pad density has further increased in new designs involving multiple stacked dies. In such cases the wire bonding process is programmed to execute wire bonds at multiple heights to accommodate more wires, without affecting the performance. Such situations are common in High density memory designs. The detection of errors in loop height in such designs is extremely complex due to overlapping and closely arranged bond wires. Prior art does not disclose loop height measurement in such situations.

There are various methods used in the prior art to measure a height of a wire loop. One example is U.S. Pat. No. 7,145,162 B2 for "Wire loop height measurement apparatus and Method". In this disclosure the reflected light incident from the wire loop is coupled to a height gauge which measures the deviation with respect to the incident light, to calculate the height. The apparatus and method requires frequent calibration, it is bulky and cumbersome to control and setup. Additionally the high cost of the apparatus makes the design complex and difficult to scale. To improve the accuracy and reliability higher resolution height gauges have to be used making their reconfiguration inflexible.

Another example of prior art is U.S. Pat. No. 5,576,828 for "Bonding Wire Detection Method". In this disclosure, the height of a wire bonded between a Semiconductor chip and a lead frame is determined using a low-angle illuminating device. The angle of illumination is set within a certain range and the focal depth of the optical device is designed to be shallow. A dark area appears in the central portion of the wire at the focal point of the optical system. The optical device is moved up and down to obtain a focused image of the dark area, so as to determine the height of the wire relative to a height of the optical system and applies to single plane bonding wires. The concept cannot be applied to overlapping bond wires. Another problem with this apparatus is that the imaging System is bulky resulting in reduced speed of inspection.

In prior art described above the wire loop height is measured on the profile of the bonded wire on a single plane. As the densities of the wire bonding has increased and the bonding wires overlap each other to match the increasingly complex silicon chip designs, there is a need in the industry to measure loop height of bonded wires which occur in more than one plane. Prior art does not address this need.

SUMMARY OF THE INVENTION

Accordingly, it is an object of the present invention to provide a bonding wire inspection method that can reliably measure the loop height of bond wires on a single plane or multiple planes due to overlapping bonding wires. It is important to note that "X, Y & Z coordinates" and "data points" are used interchangeably in the description below.

The object of the present invention is accomplished by a unique method that inspects the wires bonded between the pads of a semiconductor chip and the leads of a lead frame or substrate in which: the focus of an optical means is first brought into a desired point of the object of inspection, which is a bonded wire; then using a the XY & Z motor integrated to the Vision system, multiple images at best focused planes namely $Z1$, $Zi$ and $Zn$ at points $P1$, $Pi$ and $Pn$ are captured, wherein $1 \le i \le n$. Each point $Pi$ ($1 \le i \le n$) along the bond wire has best focused plane coordinates ($Xi$ (width), $Yi$ (Length), $Zi$ (Height)), where position $Zi$ is read from the encoders of Z motor and the coordinates ($Xi,Yi$) is calculated from the processed image of the entire silicon Chip in the Field of View (FOV) and if the silicon chip is bigger than the FOV, additionally a finer and more precise positional coordinates related the Horizontal X position and the Horizontal Y position are acquired from the X & Y motor encoders. So in effect, for a silicon chip that is bigger than the FOV, two positional coordinates are combined for each $Pi$ (Point on the bond wire) to arrive at an accurate X & Y position, one being the X and Y position from the encoders, determined by the processed image of the entire silicon chip and the second being the position read from the X & Y position from the encoders after processing an image of a smaller area of the silicon chip. This method enables locating points of interest at a very high degree of accuracy and consistency. Subsequently the X, Y and Z coordinates are tabulated in a table and plotted on a graph. This process is repeated for multiple planes in the Z direction to generate multiple tables and graphs for each and every single bonded wire, in different planes.

Another object of the present invention is accomplished using a wire detection method wherein wires bonded to pads of a semiconductor chip and leads of a lead frame or substrate are detected by illuminating the wire with an illuminating means having a pre-determined angle, preferably a low angle, so as to capture an image of the wire using an imaging device through an optical system, and the unique manner adopted by the present invention is that the wire is illuminated by the low-angle illuminating means with a pre-determined focal depth of the optical system set to be very small, thus creating a dark area in the background to eliminate all background noise or information around the bond wire in focus to enable accurate and consistent measurement of height.

Another object of the present invention is accomplished by integrating the silicon chip locating pedestal with another motor with encoder (not shown) to enable it to be positioned at a different height for faster focusing and where required for finer positioning. The silicon chip pedestal may be integrated with a backlit second illuminating module (not shown), which may be utilised when required to acquire Backlit images of the Silicon chip to measure the Length and width with a great deal of accuracy and repeatability. It may also aid in detection of defects such as epoxy overflow especially in the case of stacked die design or chip damage at the edges.

Another object of the present invention is accomplished using a wire detection method wherein a bond wire positioned below another bond wire is detected by means of tracing the path of the underlying illuminated bond wire by interpolating the XY&Z coordinates of related points on the bond wire to reliably calculate the profile of the loop and the highest point of the bond wire loop. This applies to all bond wires obstructed by overlapping bond wires. This key feature of the invention is especially important for stacked die silicon chips wherein the bond wires criss-cross each other at different points across multiple planes around the stacked dies.

Another object of the present invention is accomplished using a wire detection method wherein the speed of measuring the bond wire profile is increased by detecting and measuring more data points of the bond wires at critical areas such as interconnections at substrate pads and bond pads on the die, mid-point area and the area around the highest point of the bonding wire. Multiple bond wire profiles are plotted using the XY & Z coordinates and the highest point from the reference plane is chosen to arrive at the height for each and every bond wire. The reference plane is the plane of the substrate or the surface on which the first die is mounted. As the non-critical areas of the bond wires are left out during the measurements the speed of measuring bond wire height is increased multi-fold without affecting bond profile measurements, especially if the bond wires are longer.

Experiments show that there is a constant relationship between the focused image of the illuminated bonded wire and the actual height of the bonded wire. Accordingly, detecting the clear focused image with relatively high contrast and comparing with the other indistinct images around the area of interest, the height of a particular point of the wire can be easily and reliably measured at higher speeds. Some of the approaches applied to detecting the data points to create a profile of a bond wire include but not limited to, unified focus and defocus analysis, spatial analysis, interpolation/extrapolation mapping etc. The details of the analysis methods are not discussed, as it falls outside the scope of the invention.

It would be convenient hereinafter to describe the invention in greater detail by reference to the accompanying drawings which illustrate preferred embodiments of the invention. The particularity of the drawings and the related description is not to be understood as superseding the generality of the broad identification of the invention as defined in the claims.

BRIEF DESCRIPTION OF DRAWINGS

An example of a method and apparatus in accordance with the invention will now be described with reference to the accompanying drawings, in which.

DETAILED DESCRIPTION OF DRAWINGS

Figure 1:
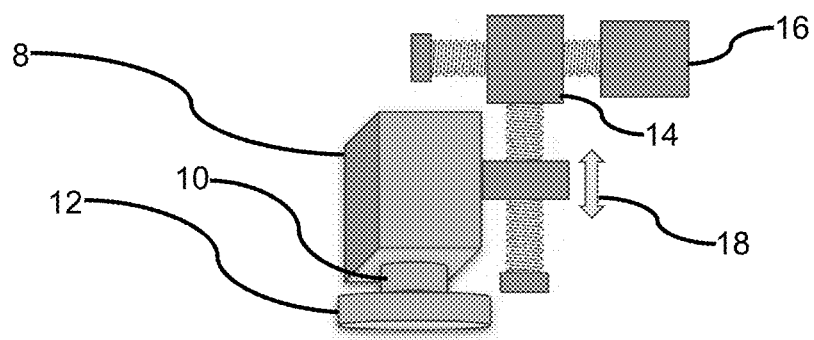
FIG. 1 is an illustration of the image capturing system comprising the Camera, Illumination, Optics and the X, Y & Z positioning mechanism.

Hereinafter, bond wires, bonding wires, interconnecting wires and interconnections will be used interchangeably while describing the accompanying drawings. It is important to note that the same reference numerals are given to the same or like members and parts in the different drawings for better clarity.

As shown in FIG. 1, the imaging system comprises a imaging device 8 suitably mounted with an optical lens 10 which in turn is integrated to the illumination module 12. The XY positioner 16 enables positioning of the image capturing system in the X and Y axis and is integrated to the Z positioner 14 to enable up and down movement 18 of the imaging system in the Z axis or alternatively. It should be noted that the XYZ positioners may be operated synchronously to enable quick positioning to achieve a maximum focused image of the bond wire across the entire Silicon Chip. The imaging system is capable of capturing high resolution images at different positions under different illumination conditions such as brightness, strobing pulse widths, various wavelengths of illumination and lighting angles to suit the material characteristics of the bond wires and silicon chip substrate. The optical system is designed for a very shallow depth of focus to eliminate any background image noise that can distort the area of interest (AOI). The optical system 12 be designed with multiple lenses or may also be integrated with a liquid lens to enable high speed focussing at multiple Z axis planes, to minimise mechanical moving parts in the assembly and as a consequence increase the speed of image capture resulting in faster inspection time.

Figure 2:
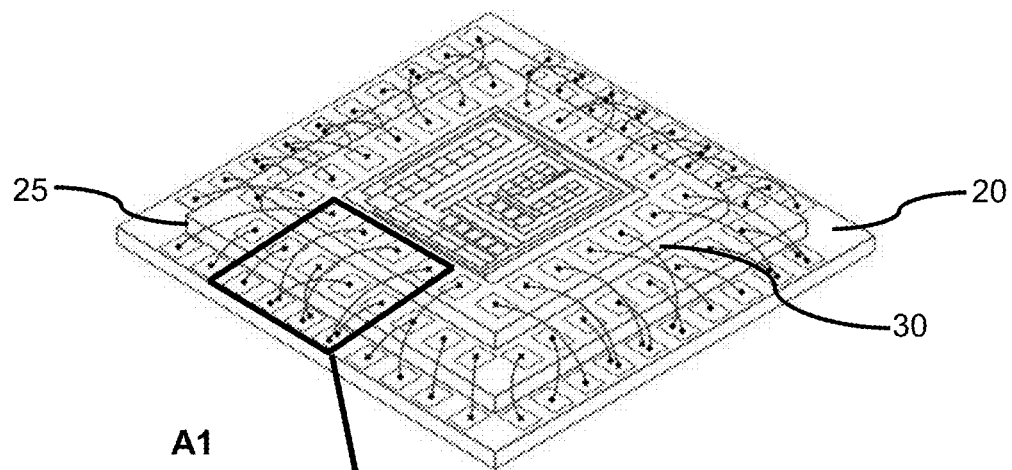
FIG. 2 is an isometric view of a substrate upon which Silicon dies are stacked and illustrating dual layers of looped wire bonds made between the die and the substrate.

In FIG. 2, an isometric view of a Silicon chip with multiple dies 25 and 30 suitably stacked on 20 that may be a die or a substrate made of plastic or Silicon material. The fixture holding the Silicon Chip may also be integrated with a suitable positioning mechanism integrated with encoders to move it up and down in the Z axis very precisely. The holding fixture (not shown) may be suitably designed to provide backlit illumination, using a second illumination means, to enable capturing dark field images by the imaging system in FIG. 1. The pads on each of the dies 20, 25 and 30 are interconnected to each other through a series of bonding wires that may occur one above the other or criss-cross each other (from the Top view) at various points and various planes of the multichip silicon chip. The present invention has special relevance to area A1 (Field of View or FOV) as an example. The bonding wires are interconnected between the base plane reference which is the surface of the first die or substrate 20, the top surface of the second die 25, and the top surface of the second die 30.

Figure 3:
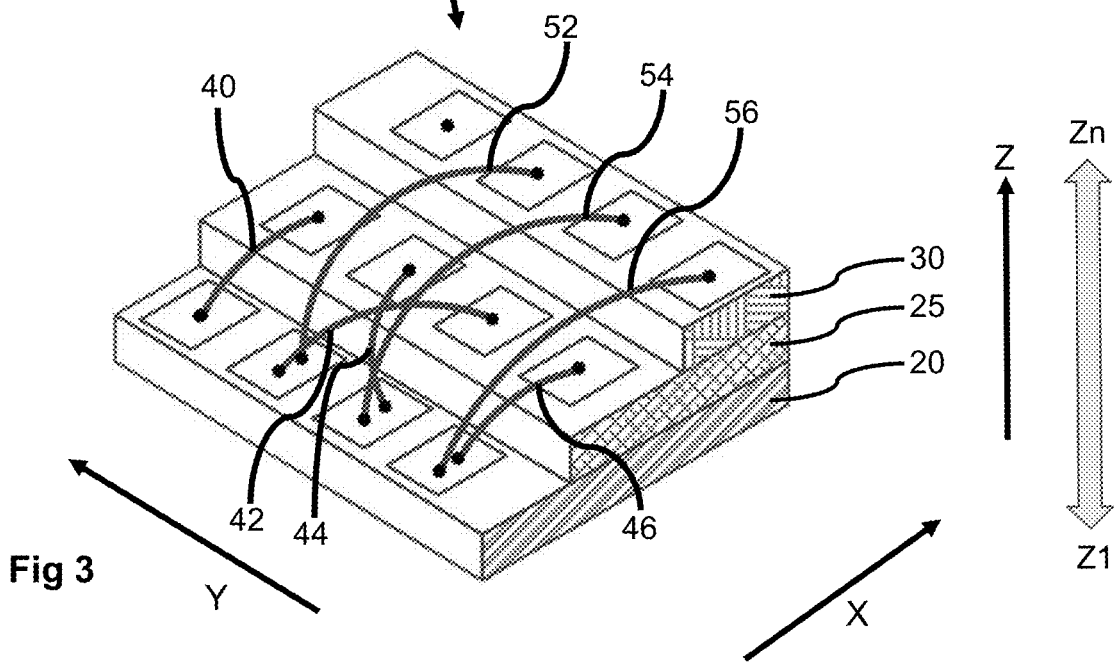
FIG. 3 shows an isometric enlarged view of the area A1 in FIG. 2 showing the bond wires between the substrate and stacked dies.

The illustration in FIG. 3 is an enlarged view of the area A1 in FIG. 2. The bonded wires in the area A1 are 40, 42, 44, 46, 52, 54 and 56 interconnecting the conductive pads on dies 20, 25 and 30. The positions between Z1 and Zn are the locations at which images are captured along the Z axis. The gap in between the various positions are programmable depending upon the area of the bond wires where the coordinates of the bond wire is determined through interpolation between two nearby points or coordinates, to minimise the bond wire profile analysis time, resulting in high speed inspection. Zn is a programmable number that determines the number of maximum focusing planes to be analysed before performing the bond wire profile analysis. A person skilled in the art will appreciate the fact that the more the number of positional points or coordinates to be determined, the longer will be the inspection time, resulting in slower inspection speed. It also means that the bond wire profile is more accurate and smoother with more number of X Y and Z coordinates.

Figure 4:
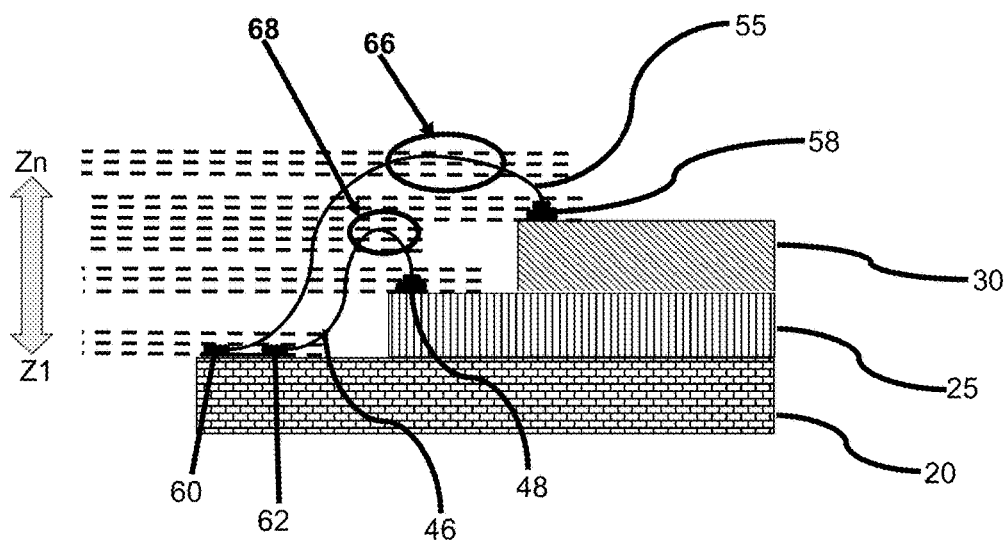
FIG. 4 shows a side view of FIG. 3 to illustrate the loop profile of two of the bond wires.

In FIG. 4 a side view perspective of a portion of the Silicon Chip in FIG. 3 is shown. A typical bond wire loop formation is shown in bond wires 46 and 55 and their respective interconnections between pads of dies 20, 25 and 30 as an example. The bond wire 46 is interconnected between the pads of dies 25 and 20 by a ball bond at 48 and stitch 62. The bond wire 55 is interconnected between the pads of dies 30 and 20 by a ball bond at 58 and stitch 60. It is important to note that there may be instances where bond wires similar to 55 and 46 may overlap or criss-cross each other without making contact. The criss-crossing of wires 42, 44 and 54 is illustrated in FIG. 3. For purposes of clarity only two bond wires 55 and 46 are shown in FIG. 4. The distinctive profiles of each of the bond wires 55 and 46 and their respective highest points 66 and 68 are of particular interest in a wire bonding process because it allows the quality control personnel to assess whether the loop is properly formed before undergoing further processing. In the preferred embodiments of this invention, the emphasis is on determining the profiles of all bonding wires, and in particular, the position and/or height of its highest point. The invention especially addresses the need to enable measuring of loop heights of bond wires positioned below each other or crossing each other during the process of wire bonding in stacked dies. The bond wire loop heights of both the upper lower bond wires (Example 55 and 46 in FIG. 4) are very key to determine the mold temperature and viscosity of molding material, as very closely placed bond wires may result in a short circuit during the mold flow process. A person skilled in the art will realise that the above issues can occur anywhere in the Silicon Chip and may affect more than one set of bond wires depending upon their bonding direction and position.

FIG. 4 also shows a side view representation of a method of determining the height of a bond wire loop using focus point in a captured image. The processor associated with the imaging system analyses the captured image of the focused plan captured at a predetermined Z height, to find the best focus point by measuring the contrast (Sharpness) of the multiple images captured at different Z positions and calculates the positions or coordinates along each of the bond wires 46 and 55 across its entire length starting from 62 to 48 for bond wire 46 and the entire length of bond wire 55 starting from 60 to 58 for bond wire 55. For example, referring to FIG. 5, each point on bond wire 42, Pi ($1 \leq i \leq n$) along the bond wire includes coordinates (Xi, Yi, Zi), where Zi comes from focusing plane coordinates from the encoder of motor 14 (Z height) in FIG. 1; the coordinates (Xi, Yi) calculated through image processing within each FOV and additionally if object under inspection is bigger than FOV, from the Horizontal X distance and the Horizontal Y Distance are recorded and stored from the encoders of motors 16 (X and Y positions) in FIG. 1. It should be appreciated here that the unit Zn represents a programmable number and can be changed depending upon how many points on a bond wire Pn and its relevant positional coordinates of X, Y and Z is required, to improve the process of calculating the loop height and loop profile of a given bond wire. The data points Pn each represented by XY and Z coordinates are calculated by capturing predetermined portions of interest of a given bond wire. For example, referring to FIG. 4, some of the critical areas of interest may include the position for example 60 of bond wire 55 and 62 of bond wire 46 on die 20 commonly referred to as a stitch. Another critical area of interest, for example are 48 on die 25 and 58 on die 30 which are commonly referred to as ball bonds. Furthermore, another critical and most important area of interest includes a portion where the highest point of the bond wire 55 and 46 which are likely to be located at 66 and 68, determined during a bonding profile setup and configuration of a wire bonder machine.

Figure 5:
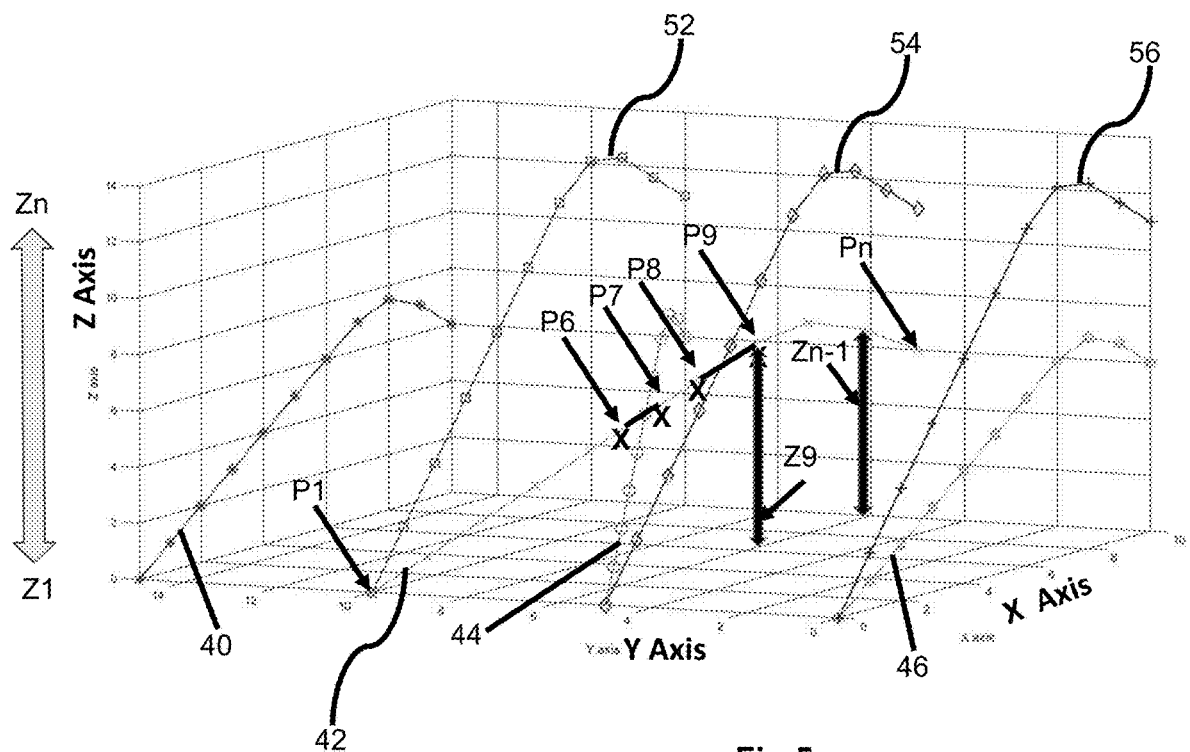
FIG. 5 shows a three dimensional chart plotting the bond wire profile of the interconnections in FIG. 3.

The graph illustrated in FIG. 5 shows the bond wire profile plot of bond wires 40, 42, 44, 46, 52, 54 and 56 shown in FIG. 3. The three-dimensional profile is plotted using the calculated data points or coordinates Pn, from the images acquired at various focused planes Z1 to Zn for each of the bond wires in FIG. 3. In FIG. 5, the X axis represents the die width as shown in FIG. 3, the Y axis represents the die length as shown in FIG. 3 and the Z axis represents the height (Horizontal focused planes) of the die as shown in FIG. 3. It is evident from the graph that due to the nature of stacked die wire bonding, there are multiple levels of bond wires that criss-cross each other as viewed from the camera in FIG. 1 (Top view). For example, from the graph in FIG. 5, the bond wire 44 is positioned at the lowest level, above which bond wire 42 is located. The bond wire 54 is positioned over bond wire 42. Such occurrences in stacked die bonding are common and therefore measuring and calculating the data points is complex and requires interpolation of XY and Z coordinates of underlying bond wires.

In FIG. 5, the three-dimensional graph for bond wires 40, 42, 44, 46, 52, 54 and 56 with their respective XY & Z coordinates at eleven locations are plotted as an illustration. For example, the Z axis heights for Z9 and Zn−1 are shown in the graph. Z axis positions or heights of points P1 to Pn are measured and stored as Z1 to Zn. The method of interpolation and in some cases, extrapolation is adopted for smooth curve fitting using the determined data points Pi ($1 \leq i \leq n$), for each bond wire. Each Pi is associated with calculated X, Y & Z coordinates to enable plotting of the bond wire profile. The curve fitting takes into account the wire loop formation setup that is normally programmed into the steps of the wire bonding process. With the aid of the three-dimensional graph it is easy to determine the loop height by applying linear equations. However, for example, when it comes to plotting the graph for bond wire 42, the process of curve fitting or linear interpolation, some complex steps are involved. In the case of bond wire 42, it is obvious to see that no data points can be calculated or determined between positions P6 and P7 as bond wire 44 is positioned over bond wire 42, and hence the nearest data points P6 and P7 determined for bond wire 42 are utilised to determine the profile of the bond wire 42 in this area, using interpolation. Similarly, another bond wire 54 blocks the view at the area between P8 and P9 of bond wire 42. As no image capture is possible in the blocked area, determination of data points is ruled out. Again here, the nearest data points P8 and P9 calculated for bond wire 42 is used to determine the profile of the bond wire 42 in this area, using interpolation. The interpolation accuracy to create a bond wire profile is directly proportional to the proximity of the data points, which in turn affects the loop height measurement of a given bond wire. It is therefore very important to determine as many data points Pn as possible, to enable plotting of a bond wire loop profile for any given bond wire and utilise interpolation or extrapolation (where required) for hidden portions of the bond wire to improve accuracy and repeatability. Upon plotting the bond wire profiles for each and every bond wire, an analysis can be made as to whether the stacked die will perform to the specification when it is molded and most importantly ensure that no bond wires are exposed outside the molding compound or whether a short circuit can occur within the molded silicon chip.

A person skilled in the art will appreciate that this invention can be applied to measurement of ball bond diameter, Ball height and Stitch profile without making any additions or modifications to the imaging system.

Hereinbefore, the invention described is susceptible to variations, modifications and/or additions other than those specifically described and it is to be understood that the invention includes all such variations, modifications and/or additions which fall within the spirit and scope of the above description.

The invention claimed is:

1. Apparatus for inspecting Z height and profile of overlapping bonded wires on multi stacked dies or like article, comprising:
   an imaging device mounted on a means capable of moving in the X, Y & Z axis coupled with high resolution encoders, to capture images of focused points on overlapping bonding wires and their respective X, Y & Z positions, at different planes;
   the imaging device optically coupled with a lens having a pre-determined focal depth;
   a processor associated with the imaging device arranged to analyse the captured images and calculate the heights, and lateral displacement of the focused points on the overlapping bonding wires and linearly interpolate each point to their neighbouring point to form an angular profile of every overlapping bonding wire;
   a strobed illuminating means having a pre-determined angle to enable image capture of illuminated overlapping bonded wires to eliminate image noise of closely placed overlapping bonded wires;
   a second illumination means mounted on a pedestal to illuminate the overlapping bonded wires under inspection to enable capturing of a backlit image.

2. An apparatus of claim 1 further comprising a third illuminating means that creates a dark area behind an area of interest viewed by the imaging device.

3. An apparatus of claim 1 further comprising a liquid lens to enable high speed focussing, coupled to the image capturing device.

4. A method for measuring the Z height and profile of wires bonded between pads of a two or more stacked semiconductor chips and a substrate, said method comprising the steps of:
   moving an image capturing system in the X, Y & Z direction to focus said image capturing system onto pre-set multiple points on the bonded wires;
   capturing images of said multiple points on the desired bonding wires in multiple Z axis planes using strobed illumination;
   reading the encoders positions of every point on the set of bonding wires and tabulating their respective X Y & Z points;
   calculating the heights, and lateral displacement of all said tabulated points of the bonding wires around the entire stacked die semiconductor chip and linearly interpolating each point to their neighbouring point to form an angular profile of every bonding wire;
   plotting a 3D graph using the tabulated points;
   analysing the 3D graph to detect bonding wires in close proximity in the XY or Z position and comparing them with pre-set parameters for rejecting or accepting the bonded multi stacked die;
   communicating the results and analysed parameters to an external interface.

5. The method of according to claim 4 further comprising analysing the 3D graph to determine the common bonding plane is the same on both ends of the bonding wires.

* * * * *